US009265167B2

(12) United States Patent
Hsu

(10) Patent No.: US 9,265,167 B2
(45) Date of Patent: Feb. 16, 2016

(54) TORQUE BALANCING DEVICE APPLIED TO SYNCHRONOUS DUAL-SHAFT SYSTEM

(71) Applicant: FIRST DOME CORPORATION, New Taipei (TW)

(72) Inventor: An Szu Hsu, New Taipei (TW)

(73) Assignee: First Dome Corporation, New Taipei (TW)

(*) Notice: Subject to any disclaimer, the term of this patent is extended or adjusted under 35 U.S.C. 154(b) by 7 days.

(21) Appl. No.: 14/273,693

(22) Filed: May 9, 2014

(65) Prior Publication Data

US 2015/0327383 A1    Nov. 12, 2015

(51) Int. Cl.
*E05D 3/06*    (2006.01)
*H05K 5/02*    (2006.01)

(52) U.S. Cl.
CPC ............. *H05K 5/0226* (2013.01); *Y10T 16/547* (2015.01)

(58) Field of Classification Search
CPC ............... E05D 3/12; E05D 3/06; E05D 3/10; E05D 11/087; G06F 1/1681; G06F 1/1616; G06F 1/1618; E05Y 2900/606; H04M 1/0216; H04M 1/0222; H04M 1/022; H05K 5/0226; Y10T 16/547; Y10T 16/5837; Y10T 16/53864; Y10T 16/541; Y10T 16/540255; Y10T 16/533; Y10T 16/5938
See application file for complete search history.

(56) References Cited

U.S. PATENT DOCUMENTS

| | | | |
|---|---|---|---|
| 2006/0238968 A1* | 10/2006 | Maatta et al. | 361/683 |
| 2012/0192381 A1* | 8/2012 | Zhang et al. | 16/366 |
| 2013/0111704 A1* | 5/2013 | Mitsui | 16/250 |
| 2013/0152342 A1* | 6/2013 | Ahn et al. | 16/354 |
| 2013/0318746 A1* | 12/2013 | Kuramochi | 16/342 |
| 2014/0038482 A1* | 2/2014 | Lu et al. | 442/60 |
| 2014/0223693 A1* | 8/2014 | Hsu | 16/282 |
| 2014/0338483 A1* | 11/2014 | Hsu et al. | 74/96 |
| 2015/0173218 A1* | 6/2015 | Hsu | 16/366 |

* cited by examiner

*Primary Examiner* — Chuck Mah
(74) *Attorney, Agent, or Firm* — Rosenberg, Klein & Lee

(57) ABSTRACT

A torque balancing device applied to synchronous dual-shaft system for making the rotary shafts bear the same torque or pressure and avoiding slippage thereof. The torque balancing device includes a first rotary shaft, a second rotary shaft and a torque balancing unit. Each of the first and second rotary shafts has a fixed section mounted on an electronic apparatus and a drive section assembled with the torque balancing unit. The torque balancing unit includes a reactor and a responder assembled with each other. Each of the reactor and the responder has wing sections for together holding the drive sections of the first and second rotary shafts in normal state. When the first and second rotary shafts rotate, the wing sections are elastically forcedly biased and opened and the reactor and the responder are moved in an axial direction relative to each other.

21 Claims, 4 Drawing Sheets

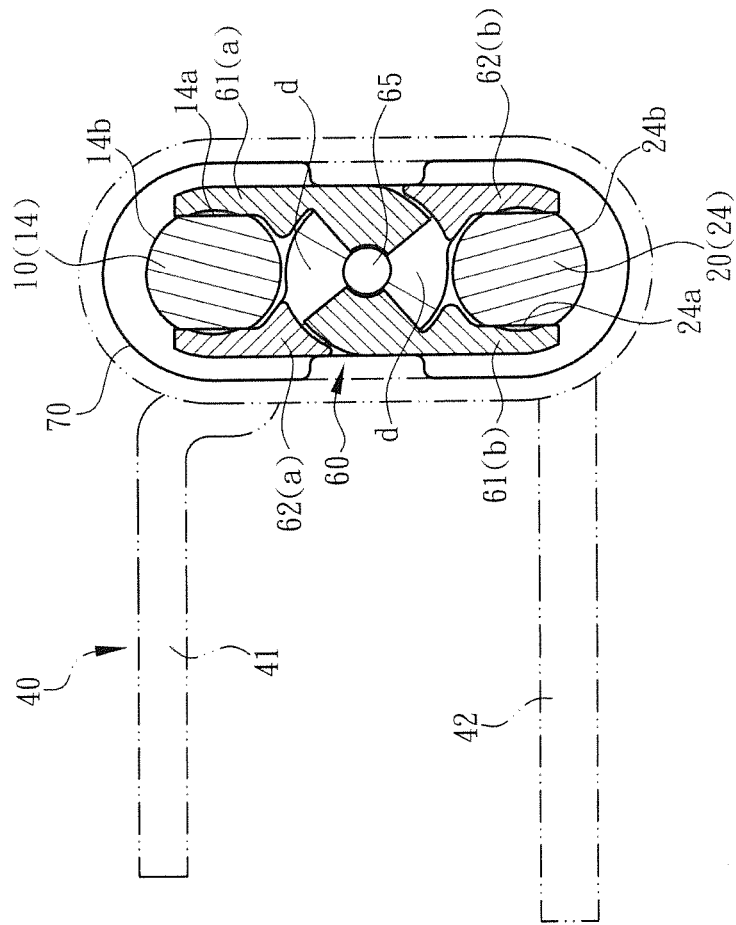
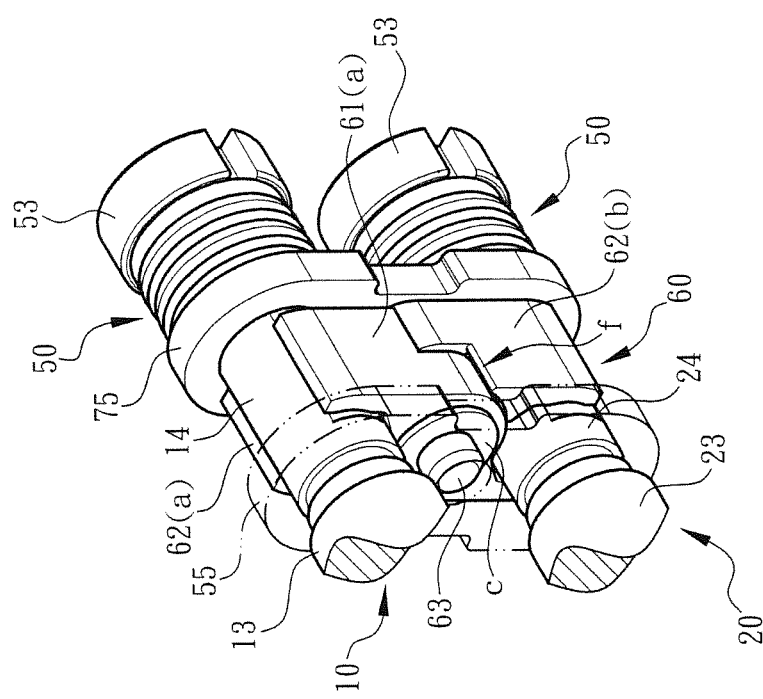
Fig. 4
Fig. 3

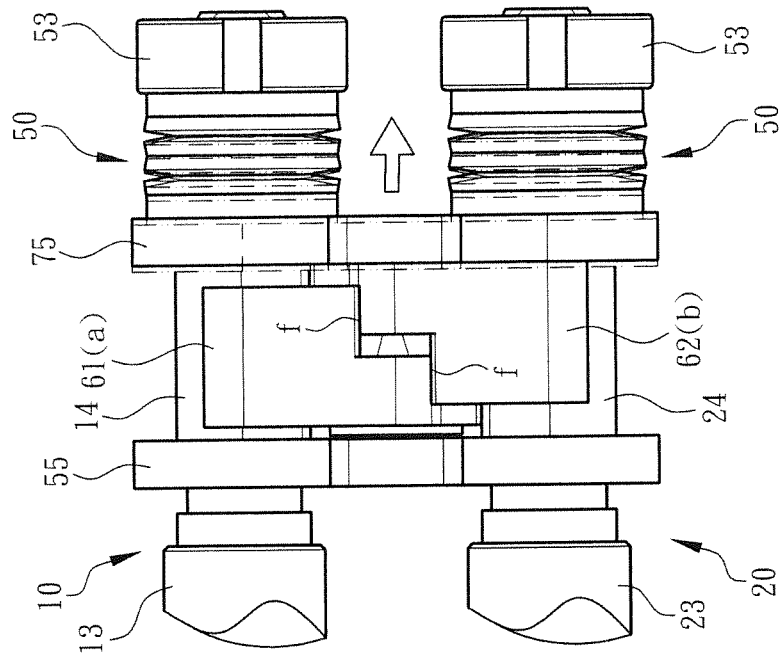
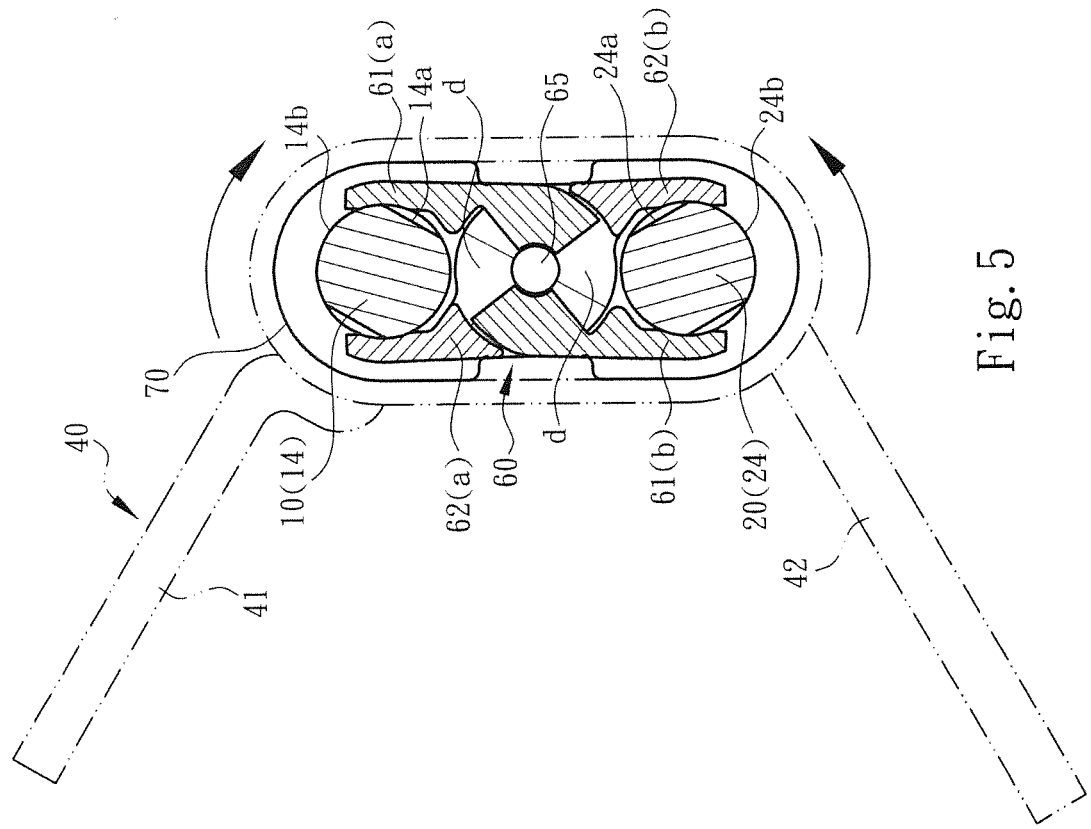
Fig. 5
Fig. 6

TORQUE BALANCING DEVICE APPLIED TO SYNCHRONOUS DUAL-SHAFT SYSTEM

BACKGROUND OF THE INVENTION

1. Field of the Invention

The present invention relates generally to a torque balancing device applied to synchronous dual-shaft system, and more particularly to torque balancing device including a reactor and a responder assembled with each other. The reactor and the responder cooperate with the torque modules to make the rotary shafts bear the same torque or pressure.

2. Description of the Related Art

There are various electronic apparatuses provided with covers or display screens, such as mobile phones, notebooks, PDA, and electronic books. The covers or display screens are pivotally mounted on the electronic apparatuses via pivot pins or rotary shafts, whereby the covers or display screens can be freely rotated and opened/closed under external force.

In order to operate the display module (such as the screen) and/or the apparatus body module of the electronic apparatus in more operation modes and application ranges, a dual-shaft mechanism is provided between the display module and the apparatus body module, whereby the display module and/or the apparatus body module can be operated in different operation modes by different rotational angles.

One end (or so-called pivoted end) of the dual-shaft mechanism is generally assembled with a torque module composed of multiple gaskets with through holes and recessed/raised locating sections, frictional plates and springs. Two ends of the rotary shafts are respectively fixedly assembled in a case by means of retainer rings or retainer plates. The other end (or so-called fixed end) of the dual-shaft mechanism is mounted on the apparatus body module and display module of the electronic apparatus. The springs cooperatively store and release energy to rotate and locate the rotary shafts.

With respect to the above dual-shaft mechanism, an assembler needs to adjust the torque modules mounted on the two rotary shafts to have the same torque or pressure, whereby the two rotary shafts can be rotated by the same rotational angle and located in the same angular position. However, as well known by those who are skilled in this field, it is troublesome and time-consuming to adjust the pressure of the torque modules mounted on the two rotary shafts to the same value. Especially, after a long period of operation of the electronic apparatus, the torque modules of the two rotary shafts will be worn to different extents. In this case, the two rotary shafts can hardly synchronously rotate. Also, in operation, the rotary shafts are likely to slip to lead to delay of transmission of kinetic energy. As a result, the electronic apparatus cannot be truly operated and the locating effect will be affected.

The conventional dual-shaft mechanism and the relevant connection components thereof have some shortcomings in use and structural design that need to be overcome. It is therefore tried by the applicant to provide a torque balancing device applied to synchronous dual-shaft system to eliminate the shortcomings existing in the conventional dual-shaft mechanism so as to widen the application range. For example, in comparison with the conventional dual-shaft mechanism, the pivot pin or rotary shaft is assembled with the torque balancing device. In response to the rotation of the electronic apparatus, the torque balancing device can keep the first and second rotary shafts having the same torque or pressure so as to enhance the stability and smoothness of synchronous move of the rotary shafts and minimize the possibility of slippage of the rotary shafts and ensure that the rotary shafts can truly synchronously rotate. In this case, the electronic apparatus can be more smoothly operated and truly located. Moreover, the torque balancing device of the present invention can be easily assembled. In contrast, it is troublesome and time-consuming to adjust the conventional torque modules.

SUMMARY OF THE INVENTION

It is therefore a primary object of the present invention to provide a torque balancing device applied to synchronous dual-shaft system for making the rotary shafts bear the same torque or pressure and synchronizing the move of the rotary shafts and locating the rotary shafts and avoiding slippage thereof. The torque balancing device includes an assembly of a first rotary shaft, a second rotary shaft and a torque balancing unit. Each of the first and second rotary shafts has a fixed section mounted on an electronic apparatus and a drive section assembled with the torque balancing unit. The torque balancing unit includes a reactor and a responder assembled with each other. Each of the reactor and the responder has wing sections for together holding the drive sections of the first and second rotary shafts in normal state. When the first and second rotary shafts rotate, the wing sections are elastically forcedly biased and opened or restored to their home positions and the reactor and the responder are moved in an axial direction relative to each other. Accordingly, the rotary shafts can truly synchronously rotate and the delay of transmission of kinetic energy can be avoided.

In the above torque balancing device, each of the reactor and the responder has a central section formed with at least one raised section and recessed section. The raised section of the reactor is positioned on the recessed section of the responder, while the raised section of the responder is positioned on the recessed section of the reactor. When the first rotary shaft or the second rotary shaft rotates, the raised section of the reactor is forcedly moved from the recessed section of the responder to the raised section of the responder and the reactor and the responder move in the axial direction relative to each other.

The present invention can be best understood through the following description and accompanying drawings, wherein:

BRIEF DESCRIPTION OF THE DRAWINGS

FIG. 3 is a perspective assembled view of the torque balancing device of the present invention, showing the cooperation between the first and second rotary shafts, the reactor, the responder and the torque modules;

FIG. 4 is a sectional view according to FIG. 3, showing the cooperation between the drive sections of the first and second rotary shafts, the reactor and the responder;

FIG. 5 is a sectional view according to FIG. 4, showing that the first and second rotary shafts are synchronously 30-degree rotated to open the reactor and the responder; and FIG. 6 is a plane view according to FIG. 5, showing that the reactor and the responder are moved in the axial direction relative to each other.

DETAILED DESCRIPTION OF THE PREFERRED EMBODIMENTS

Figure 1:
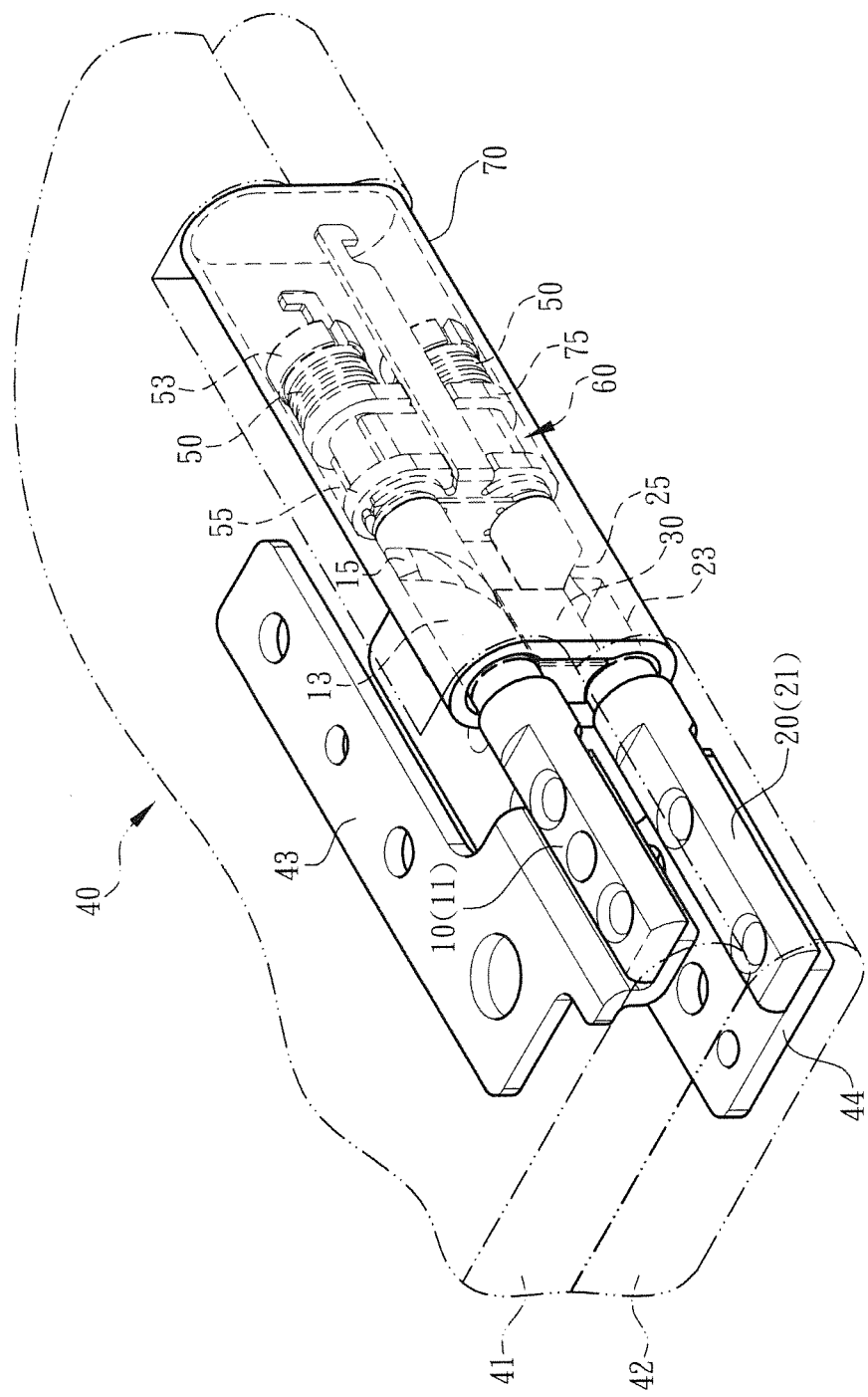
FIG. 1 is a perspective assembled view of the torque balancing device of the present invention, showing the cooperation between the first and second rotary shafts, the transmission unit, the reactor, the responder and the torque modules, in which the phantom lines show that the first and second rotary shafts are mounted on an electronic apparatus.
Figure 2:
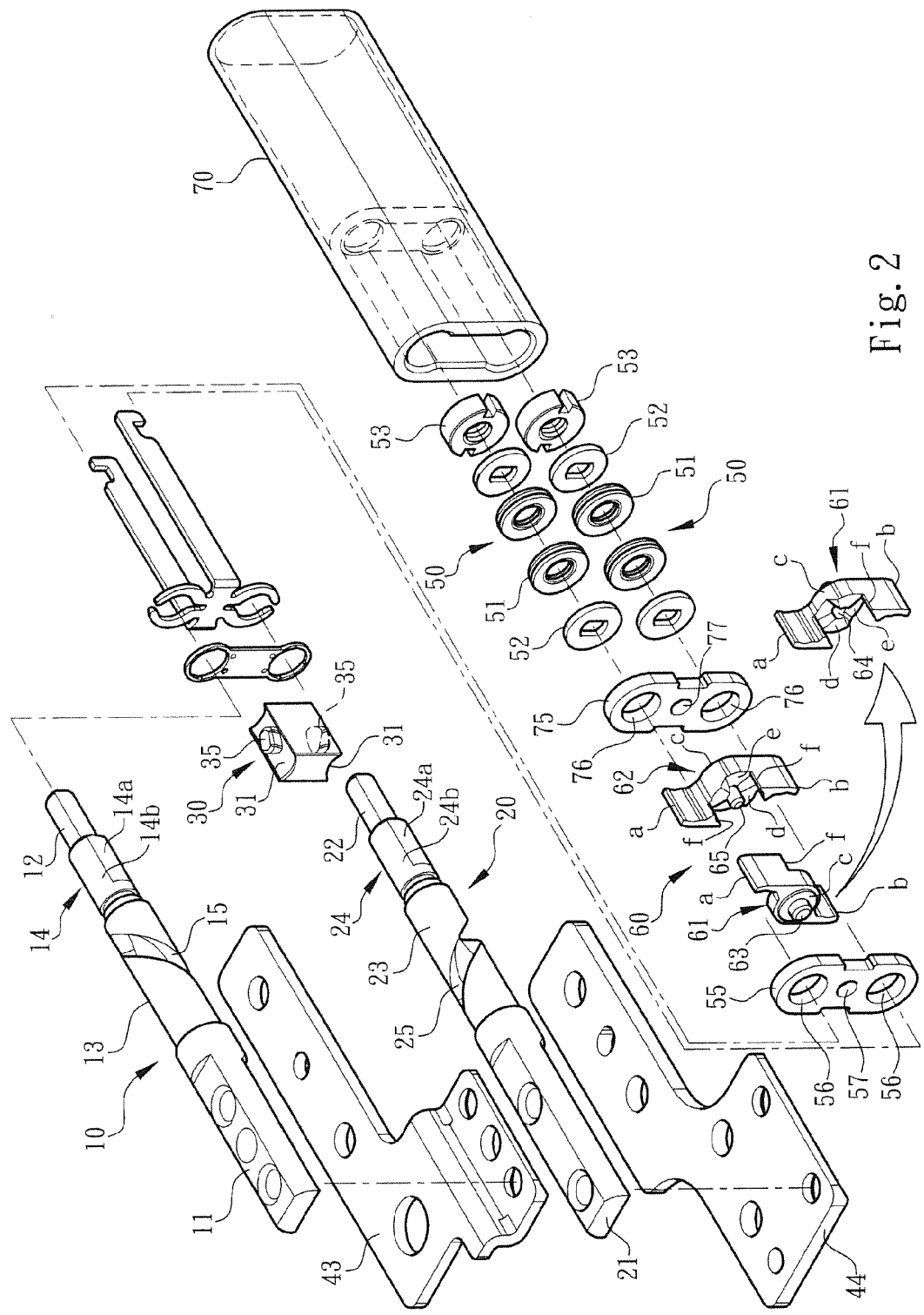
FIG. 2 is a perspective exploded view of the torque balancing device of the present invention, showing the structural form of the first and second rotary shafts, the transmission unit, the reactor, the responder and the torque modules.

Please refer to FIGS. 1, 2 and 3. According to a preferred embodiment, the torque balancing device applied to synchronous dual-shaft system of the present invention is assembled with an electronic apparatus (such as a mobile phone or a computer) for illustration purposes. The torque balancing device includes a first rotary shaft 10, a second rotary shaft 20 and a torque balancing unit 60, which are assembled with each other. Each of the first and second rotary shafts 10, 20 has a fixed section 11, 21 and a pivoted section 12, 22. A link section 13, 23 and a drive section 14, 24 are formed between the fixed section 11, 21 and the pivoted section 12, 22.

In this embodiment, the fixed section 11, 21 is connected with the link section 13, 23 and the link section 13, 23 is connected with the drive section 14, 24. The drive section 14, 24 is connected with the pivoted section 12, 22. The drive section 14, 24 has at least one plane section 14a, 24a and an arched section 14b, 24b connected with the plane section 14a, 24a.

The fixed section 11 of the first rotary shaft is connected with and disposed on a display module 41 of the electronic apparatus 40 via a fixing seat 43. The fixed section 21 of the second rotary shaft is connected with and disposed on an apparatus body module 42 of the electronic apparatus 40 via a fixing seat 44. The pivoted sections 12, 22 of the first and second rotary shafts 10, 20 are respectively assembled with torque modules 50. Accordingly, when the display module 41 or the apparatus body module 42 is released from the rotating force of a user, the first and second rotary shafts 10, 20 are immediately located.

In this embodiment, the first and second rotary shafts 10, 20 are assembled with a transmission unit 30. The transmission unit 30 is a block body having two sides 31 and guide sections 35 formed on the two sides 31. The guide section 35 has the form of a stake. The transmission unit 30 is positioned between the link sections 13, 23 of the first and second rotary shafts 10, 20 for synchronously rotating the first and second rotary shafts 10, 20.

To speak more specifically, the surfaces of the link sections 13, 23 of the first and second rotary shafts 10, 20 are formed with guiding sections 15, 25 in the form of spiral grooves. The guide sections 35 of the transmission unit 30 are respectively inlaid in the guiding sections 15, 25. Accordingly, when a user operates and rotates the display module 41 to rotate the second rotary shaft 20, the transmission unit 30 is driven to drive and rotate the first rotary shaft 10 and the apparatus body module 42.

In this embodiment, the torque balancing unit 60 is disposed and assembled between the drive section 14 of the first rotary shaft and the drive section 24 of the second rotary shaft. A fixing plate 55 and a restriction plate 75 are respectively arranged on two sides of the torque balancing unit 60. The fixing plate 55 is positioned between the link section 13 (or 23) and the drive section 14 (or 24). The restriction plate 75 is positioned between the drive section 14 (or 24) and the pivoted section 12 (or 22). The fixing plate 55 is formed with two assembling holes 56 for the drive sections 14, 24 and pivoted sections 12, 22 of the first and second rotary shafts 10, 20 to pass through. The restriction plate 75 is formed with two assembling holes 76 for the pivoted sections 12, 22 of the first and second rotary shafts 10, 20 to pass through to assemble with the torque modules 50.

As shown in FIGS. 1, 2 and 3, the torque balancing unit 60 includes a reactor 61 and a responder 62 assembled with each other. Each of the reactor 61 and the responder 62 has wing sections a, b, which together hold the drive sections 14, 24 of the first and second rotary shafts 10, 20 in normal state. When the first and second rotary shafts 10, 20 rotate, the wing sections a, b are elastically forcedly biased outward and opened and the reactor 61 and the responder 62 are moved in the axial direction of the first and second rotary shafts 10, 20 relative to each other.

To speak more specifically, each of the reactor 61 and the responder 62 has a central section c and at least one raised section d and recessed section e formed on the central section c. The raised section d and the recessed section e are arranged in adjacency to each other. Preferably, two sides of the raised section d are inclined toward the recessed section e to form a slope structure.

The wing sections a, b respectively diagonally protrude from the central section c. A cut f is formed between the wing sections a, b and the central section c, whereby when assembling the reactor 61 and the responder 62, the wing sections a, b will not interfere with each other. Each of the reactor 61 and the responder 62 has a substantially S-shaped cross section. Two sides of the central section c of the reactor 61 respectively have a shaft 63 and a hole 64. The shaft 63 is mounted in a hole 57 of the fixing plate 55. The central section c of the responder 62 has a central shaft 65 having a first end and a second end. The first end is pivotally connected in the hole 64 of the reactor 61. The second end is mounted in a hole 77 of the restriction plate 75.

Accordingly, the raised section d of the reactor 61 is positioned on the recessed section e of the responder 62, while the raised section d of the responder 62 is positioned on the recessed section e of the reactor 61, whereby the reactor 61 and the responder 62 together form a substantially X-shaped structure. The wing sections a of the reactor 61 and the responder 62 together hold the drive section 14 of the first rotary shaft 10 and the wing sections b of the reactor 61 and the responder 62 together hold the drive section 24 of the second rotary shaft 20. When the first rotary shaft 10 or the second rotary shaft 20 rotates, the wing sections a, b are elastically forcedly biased and the raised section d of the reactor 61 moves from the recessed section e of the responder 62 to the raised section d of the responder 62, whereby the reactor 61 and the responder 62 move in the axial direction relative to each other. This will be further described hereinafter.

In a preferred embodiment, the link sections 13, 23, the drive sections 14, 24 and the pivoted sections 12, 22 of the first and second rotary shafts 10, 20 and the transmission unit 30 and the torque balancing unit 60 and the torque modules 50 are enclosed in a fixing case 70.

As shown in FIGS. 1, 2 and 3, the torque module 50 includes multiple spring gaskets 51, frictional plates 52 and fixing nuts 53, which are assembled on the pivoted sections 12, 22 of the first and second rotary shafts 10, 20 to provide torque for helping in locating the display module 41 or the apparatus body module 42 after rotated.

Please now refer to FIG. 4. The wing sections a of the reactor 61 and the responder 62 together hold the plane section 14a of the drive section 14 of the first rotary shaft. The wing sections b of the reactor 61 and the responder 62 together hold the plane section 24a of the drive section 24 of the second rotary shaft. This state is defined as a closed position where the display module 41 is closed onto the apparatus body module 42. In this state, the torque module 50 applies an axial push force to the torque balancing unit 60 to elastically fasten the torque balancing unit 60, whereby the reactor 61 and the responder 62 cooperate with each other to hold the first and second rotary shafts 10, 20.

Please now refer to FIGS. 5 and 6. When a user rotates and opens the display module 41 to drive and rotate the first rotary shaft 10, the guiding section 15 of the link section 13 of the first rotary shaft forces the transmission unit 30 to move in the axial direction of the first and second rotary shafts 10, 20. At this time, the guiding section 25 of the second rotary shaft 20 is driven to make the second rotary shaft 20 and the apparatus body module 42 synchronously rotate.

When the first and second rotary shafts 10, 20 are synchronously rotated, the plane section 14*a* of the drive section 14 of the first rotary shaft 10 leaves the wing sections a of the reactor 61 and the responder 62. Also, the plane section 24*a* of the drive section 24 of the second rotary shaft 20 leaves the wing sections b of the reactor 61 and the responder 62. When the arched sections 14*b*, 24*b* of the drive sections 14, 24 of the first and second rotary shafts go toward the wing sections a, b of the reactor 61 and the responder 62, the arched sections 14*b*, 24*b* will forcedly bias open the wing sections a, b and make the reactor 61 and the responder 62 rotate. Accordingly, the raised section d of the reactor 61 will relatively move from the recessed section e of the responder 62 along the slope structure to the raised section d of the responder 62. At this time, the reactor 61 and the responder 62 resist against the torque or pressure of the torque modules 50 to move in the axial direction relative to each other as shown in FIG. 6.

It should be noted that when the first and second rotary shafts 10, 20 are further rotated and opened, the plane sections 14*a*, 24*a* will go to the wing sections a, b of the reactor 61 and the responder 62. At this time, the raised section d of the reactor 61 (and the raised section d of the responder 62) is again relatively moved to the recessed section e of the responder 62 (and the recessed section e of the reactor 61). The torque modules 50 force the reactor 61 and the responder 62 to move in the axial direction back to their home positions. At this time, the wing sections a, b are restored from the opened state to the state of FIG. 4.

In comparison with the conventional device, the torque balancing device applied to synchronous dual-shaft system of the present invention has the following advantages:

1. The rotary shafts and the relevant components are redesigned and different from the conventional device in use and operation form. For example, the drive sections 14, 24 of the first and second rotary shafts 10, 20 are assembled with the torque balancing unit 60. The wing sections a, b of the reactor 61 and the responder 62 together hold the first and second rotary shafts 10, 20. The central sections c of the reactor 61 and the responder 62 are formed with the cooperative raised sections d and recessed sections e, whereby the reactor 61 and the responder 62 together form a scissors structure. When the electronic apparatus 40 is operated and rotated, the first and second rotary shafts 10, 20 have the same torque or pressure. (That is, when the wing sections a of the reactor 61 and the responder 62 are opened, the wing sections b at the other end will be synchronously opened). This can enhance the stability and smoothness of the synchronous move of the rotary shafts and minimize the possibility of slippage of the rotary shafts. In this case, the delay of transmission of kinetic energy can be avoided and the electronic apparatus can be more smoothly operated and truly located.
2. The drive sections 14, 24 of the first and second rotary shafts 10, 20 are assembled with the torque balancing unit 60, whereby it is ensure that the rotary shafts can truly synchronously rotate. In this case, the electronic apparatus can be more smoothly operated and truly located. Especially, the torque balancing device of the present invention can be easily assembled, permitting the torque modules 50 of the first and second rotary shafts 10, 20 to have slightly different torques. When the different torques are transmitted to the torque balancing unit 60, the reactor 61 and the responder 62 synchronously move to ensure that the first and second rotary shafts 10, 20 bear the same pressure. In other words, the torque balancing unit 60 can overcome the problem of the conventional device that it is troublesome and time-consuming to adjust the torque of the torque modules.

In conclusion, the torque balancing device applied to synchronous dual-shaft system of the present invention is different from and advantageous over the conventional device.

The above embodiments are only used to illustrate the present invention, not intended to limit the scope thereof. Many modifications of the above embodiments can be made without departing from the spirit of the present invention.

What is claimed is:

1. A torque balancing device applied to synchronous dual-shaft system, comprising:
    a first rotary shaft;
    a second rotary shaft; and
    a torque balancing unit assembled with the first and second rotary shafts, the first and second rotary shafts being defined with an axial direction, each of the first and second rotary shafts having a fixed section, a link section, a drive section and a pivoted section, the torque balancing unit including a reactor and a responder assembled with each other, each of the reactor and the responder having a central section and wing sections protruding from the central section, said central section having an axis of rotation positioned between said first and secondary rotary shafts and said axis of rotation being aligned in said axial direction, the drive section of the first rotary shaft having at least one plane section and an arched section connected with the plane section, the drive section of the second rotary shaft having at least one plane section and an arched section connected with the plane section, the wing sections of the reactor and the responder together releasably engaging the at least one plane section of each of the drive sections of the first and second rotary shafts in a first state, when the first and second rotary shafts rotate, the wing sections being forcedly moved to release the at least one plane section of each of said drive sections by the rotation of said arch section of each of said drive sections and the reactor and the responder being moved in the axial direction relative to each other;
    wherein the central section of the reactor being formed with at least one raised section and recessed section and the central section of the responder being formed with at least one raised section and recessed section, the raised section and the recessed section of both said reactor and said responder being arranged in adjacency to each other, two sides of the raised section being inclined toward the recessed section to form a slope structure, the wing sections respectively diagonally protruding from each central section, whereby each of the reactor and the responder has two wing sections to form a substantially S-shaped cross section, a cut being formed between the wing sections and the central section, when said first and second rotary shafts rotate, said raised section of said reactor and said raised section of said responder are rotated to a position of contact providing an axial force for moving said reactor and said responder in said axial direction relative to each other.
2. The torque balancing device applied to synchronous dual-shaft system as claimed in claim 1, wherein two sides of the central section of the reactor respectively have a shaft and a hole, the central section of the responder having a central shaft having a first end and a second end, the first end being pivotally connected in the hole of the reactor, whereby the raised section of the reactor is positioned on the recessed section of the responder, while the raised section of the responder is positioned on the recessed section of the reactor, one wing section from each of the reactor and the responder together releaseably engaging the drive section of the first rotary shaft, the other wing section from each of the reactor and the responder together releaseably engaging the drive section of the second rotary shaft, the reactor and the responder together forming an X-shaped structure.

3. The torque balancing device applied to synchronous dual-shaft system as claimed in claim 2, wherein the fixed section is connected with the link section and the link section is connected with the drive section and the drive section is connected with the pivoted section.

4. The torque balancing device applied to synchronous dual-shaft system as claimed in claim 2, wherein a fixing plate and a restriction plate are respectively arranged on two sides of the torque balancing unit, the fixing plate being positioned between the link section and the drive section, the restriction plate being positioned between the drive section and the pivoted section, the fixing plate being formed with two assembling holes for the drive sections and pivoted sections of the first and second rotary shafts to pass through, the shaft of the reactor being mounted in a hole of the fixing plate, the second end of the central shaft of the responder being mounted in a hole of the restriction plate, the restriction plate being formed with two assembling holes for the pivoted sections of the first and second rotary shafts to pass through to assemble with torque modules, each torque module including multiple spring gaskets, frictional plates and fixing nuts.

5. The torque balancing device applied to synchronous dual-shaft system as claimed in claim 4, wherein the fixed section is connected with the link section and the link section is connected with the drive section and the drive section is connected with the pivoted section.

6. The torque balancing device applied to synchronous dual-shaft system as claimed in claim 4, wherein the fixed section of the first rotary shaft is connected with and disposed on a display module of an electronic apparatus and the fixed section of the second rotary shaft is connected with and disposed on an apparatus body module of the electronic apparatus.

7. The torque balancing device applied to synchronous dual-shaft system as claimed in claim 4, wherein a transmission unit is disposed between the link sections of the first and second rotary shafts, the link sections of the first and second rotary shafts being formed with guiding sections, the transmission unit having two sides and guide sections formed on the two sides, the guide sections of the transmission unit being drivingly connected with the guiding sections, whereby the first and second rotary shafts can synchronously rotate.

8. The torque balancing device applied to synchronous dual-shaft system as claimed in claim 7, wherein the guide section of the transmission unit has the form of a stake and the guiding sections are formed on surfaces of the link sections of the first and second rotary shafts in the form of spiral grooves, the guide sections of the transmission unit being inlaid in the guiding sections.

9. The torque balancing device applied to synchronous dual-shaft system as claimed in claim 7, wherein the link sections, the drive sections and the pivoted sections of the first and second rotary shafts and the transmission unit and the torque balancing unit and the torque modules are enclosed in a fixing case, each torque module including multiple spring gaskets, frictional plates and fixing nuts.

10. The torque balancing device applied to synchronous dual-shaft system as claimed in claim 2, wherein the fixed section of the first rotary shaft is connected with and disposed on a display module of an electronic apparatus and the fixed section of the second rotary shaft is connected with and disposed on an apparatus body module of the electronic apparatus.

11. The torque balancing device applied to synchronous dual-shaft system as claimed in claim 2, wherein a transmission unit is disposed between the link sections of the first and second rotary shafts, the link sections of the first and second rotary shafts being formed with guiding sections, the transmission unit having two sides and guide sections formed on the two sides, the guide sections of the transmission unit being drivingly connected with the guiding sections, whereby the first and second rotary shafts can synchronously rotate.

12. The torque balancing device applied to synchronous dual-shaft system as claimed in claim 11, wherein the guide section of the transmission unit has the form of a stake and the guiding sections are formed on surfaces of the link sections of the first and second rotary shafts in the form of spiral grooves, the guide sections of the transmission unit being inlaid in the guiding sections.

13. The torque balancing device applied to synchronous dual-shaft system as claimed in claim 11, wherein the link sections, the drive sections and the pivoted sections of the first and second rotary shafts, the transmission unit, the torque balancing unit and a pair of torque modules are enclosed in a fixing case, each torque module including multiple spring gaskets, frictional plates and fixing nuts.

14. The torque balancing device applied to synchronous dual-shaft system as claimed in claim 1, wherein the fixed section of the first rotary shaft is connected with and disposed on a display module of an electronic apparatus and the fixed section of the second rotary shaft is connected with and disposed on an apparatus body module of the electronic apparatus.

15. The torque balancing device applied to synchronous dual-shaft system as claimed in claim 1, wherein a transmission unit is disposed between the link sections of the first and second rotary shafts, the link sections of the first and second rotary shafts being formed with guiding sections, the transmission unit having two sides and guide sections formed on the two sides, the guide sections of the transmission unit being drivingly connected with the guiding sections, whereby the first and second rotary shafts can synchronously rotate.

16. The torque balancing device applied to synchronous dual-shaft system as claimed in claim 15, wherein the guide section of the transmission unit has the form of a stake and the guiding sections are formed on surfaces of the link sections of the first and second rotary shafts in the form of spiral grooves, the guide sections of the transmission unit being inlaid in the guiding sections.

17. The torque balancing device applied to synchronous dual-shaft system as claimed in claim 15, wherein the link sections, the drive sections and the pivoted sections of the first and second rotary shafts, the transmission unit, the torque balancing unit and a pair of torque modules are enclosed in a fixing case, each torque module including multiple spring gaskets, frictional plates and fixing nuts.

18. A torque balancing device applied to synchronous dual-shaft system, comprising:
a first rotary shaft;
a second rotary shaft; and a torque balancing unit assembled with the first and second rotary shafts, the first and second rotary shafts being defined with an axial direction, each of the first and second rotary shafts having a fixed section, a link section, a drive section and a pivoted section, the torque balancing unit including a reactor and a responder assembled with each other, each of the reactor and the responder having a central section and wing sections protruding from the central section, said central section having an axis of rotation positioned between said first and secondary rotary shafts and said axis of rotation being aligned in said axial direction, the drive section of the first rotary shaft having at least one plane section and an arched section connected with the plane section, the drive section of the second rotary shaft having at least one plane section and an arched section connected with the plane section, the wing sections of the reactor and the responder together releasably engaging the at least one plane section of each of the drive sections of the first and second rotary shafts in a first state, when the first and second rotary shafts rotate, the wing sections being forcedly moved to release the at least one plane section of each of said drive sections by the rotation of said arch section of each of said drive sections and the reactor and the responder being moved in the axial direction relative to each other;

wherein the central section of the reactor being formed with at least one raised section and recessed section and the central section of the responder being formed with at least one raised section and recessed section, the raised section and the recessed section of both said reactor and said responder being arranged in adjacency to each other, two sides of the raised section being inclined toward the recessed section to form a slope structure, the wing sections respectively diagonally protruding from each central section, whereby each of the reactor and the responder has two wing sections to form a substantially S-shaped cross section, a cut being formed between the wing sections and the central section; when said first and second rotary shafts rotate, said raised section of said reactor and said raised section of said responder are rotated to a position of contact providing an axial force for moving said reactor and said responder in said axial direction relative to each other;

wherein the fixed section is connected with the link section and the link section is connected with the drive section and the drive section is connected with the pivoted section.

19. A torque balancing device applied to synchronous dual-shaft system, comprising:

a first rotary shaft;

a second rotary shaft; and a torque balancing unit assembled with the first and second rotary shafts, the first and second rotary shafts being defined with an axial direction, each of the first and second rotary shafts having a fixed section, a link section, a drive section and a pivoted section, the torque balancing unit including a reactor and a responder assembled with each other, each of the reactor and the responder having a central section and wing sections protruding from the central section, said central section having an axis of rotation positioned between said first and secondary rotary shafts and said axis of rotation being aligned in said axial direction, the drive section of the first rotary shaft having at least one plane section and an arched section connected with the plane section, the drive section of the second rotary shaft having at least one plane section and an arched section connected with the plane section, the wing sections of the reactor and the responder together releasably engaging the at least one plane section of each of the drive sections of the first and second rotary shafts in a first state, when the first and second rotary shafts rotate, the wing sections being forcedly moved to release the at least one plane section of each of said drive sections by the rotation of said arch section of each of said drive sections and the reactor and the responder being moved in the axial direction relative to each other;

wherein the central section of the reactor being formed with at least one raised section and recessed section and the central section of the responder being formed with at least one raised section and recessed section, the raised section and the recessed section of both said reactor and said responder being arranged in adjacency to each other, two sides of the raised section being inclined toward the recessed section to form a slope structure, the wing sections respectively diagonally protruding from each central section, whereby each of the reactor and the responder has two wing sections to form a substantially S-shaped cross section, a cut being formed between the wing sections and the central section, when said first and second rotary shafts rotate, said raised section of said reactor and said raised section of said responder are rotated to a position of contact providing an axial force for moving said reactor and said responder in said axial direction relative to each other;

wherein a transmission unit is disposed between the link sections of the first and second rotary shafts, the link sections of the first and second rotary shafts being formed with guiding sections, the transmission unit having two sides and guide sections formed on the two sides, the guide sections of the transmission unit being drivingly connected with the guiding sections, whereby the first and second rotary shafts can synchronously rotate.

20. The torque balancing device applied to synchronous dual-shaft system as claimed in claim 19, wherein the guide section of the transmission unit has the form of a stake and the guiding sections are formed on surfaces of the link sections of the first and second rotary shafts in the form of spiral grooves, the guide sections of the transmission unit being inlaid in the guiding sections.

21. The torque balancing device applied to synchronous dual-shaft system as claimed in claim 19, wherein the link sections, the drive sections and the pivoted sections of the first and second rotary shafts, the transmission unit, the torque balancing unit and a pair of torque modules are enclosed in a fixing case, each torque module including multiple spring gaskets, frictional plates and fixing nuts.

* * * * *